United States Patent [19]

Opfer et al.

[11] 4,221,834
[45] Sep. 9, 1980

[54] SUPERCONDUCTIVE MAGNETIC SHIELD AND METHOD OF MAKING SAME

[75] Inventors: James E. Opfer; John M. Pierce, both of Palo Alto; Lawrence E. Valby, Mountain View, all of Calif.

[73] Assignee: Develco, Inc., Mountain View, Calif.

[21] Appl. No.: 632,208

[22] Filed: Nov. 17, 1975

[51] Int. Cl.² .................. B32B 7/14; H01L 39/02; H01L 39/14
[52] U.S. Cl. ............................ 428/198; 428/201; 428/209; 428/418; 428/457; 156/291; 29/599; 427/62; 427/63
[58] Field of Search ............... 428/198, 201, 209, 418, 428/457; 156/291; 29/599; 427/62, 63

[56] References Cited

U.S. PATENT DOCUMENTS

| | | | |
|---|---|---|---|
| 1,445,070 | 2/1923 | Clune | 156/291 |
| 3,152,035 | 10/1964 | Kirschner | 428/201 |
| 3,655,502 | 4/1972 | Yoshikawa | 428/198 |

OTHER PUBLICATIONS

Kazuo; *Superconducting Magnetic Shield*, Chem. Abstracts, vol. 71 p. 17121(d) (1969).
McKaney et al., *Adhesive...Superconducting Coils*, Chem Abstracts, vol. 72, p. 4097w (1970).
McKaney et al., IEEE Trans. Nuc. Sci., vol. 16 (No. 3) pp. 734–735 (1969).

*Primary Examiner*—Michael F. Esposito
*Attorney, Agent, or Firm*—Harry E. Aine; Harvey G. Lowhurst

[57] ABSTRACT

A relatively thin superconductive magnetic shield, as of lead, is supported from a hollow support structure, as of aluminum or fiberglass by means of a multiplicity of spots of adhesive, as of epoxy, serving to bond the superconducting shield to the support structure. The shield and support structure is then positioned within a reentrant cryostat and cooled to liquid helium temperature to render the shield superconductive. Adjacent edges of the shield material are outwardly flanged and sealed together at the flanged portions, as by welding. The spot pattern of adhesive permits the shield to flex during thermal cycling to relieve strain and prevent fracture thereof while at the same time supporting the shield in a substantially nonmicrophonic manner.

5 Claims, 4 Drawing Figures

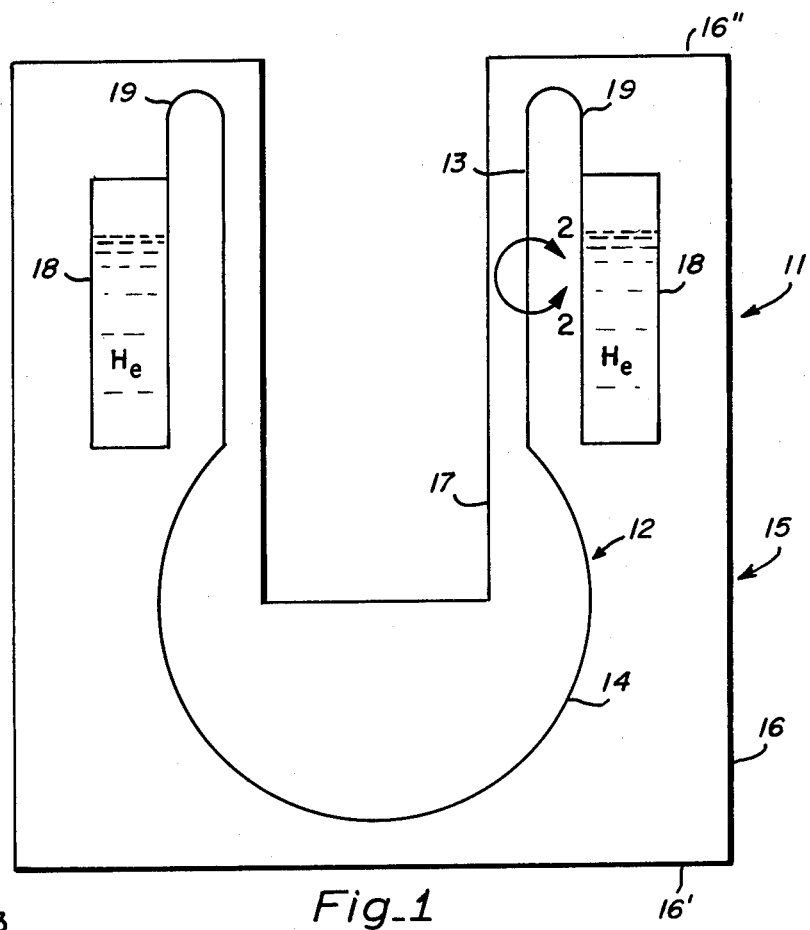
Fig_1
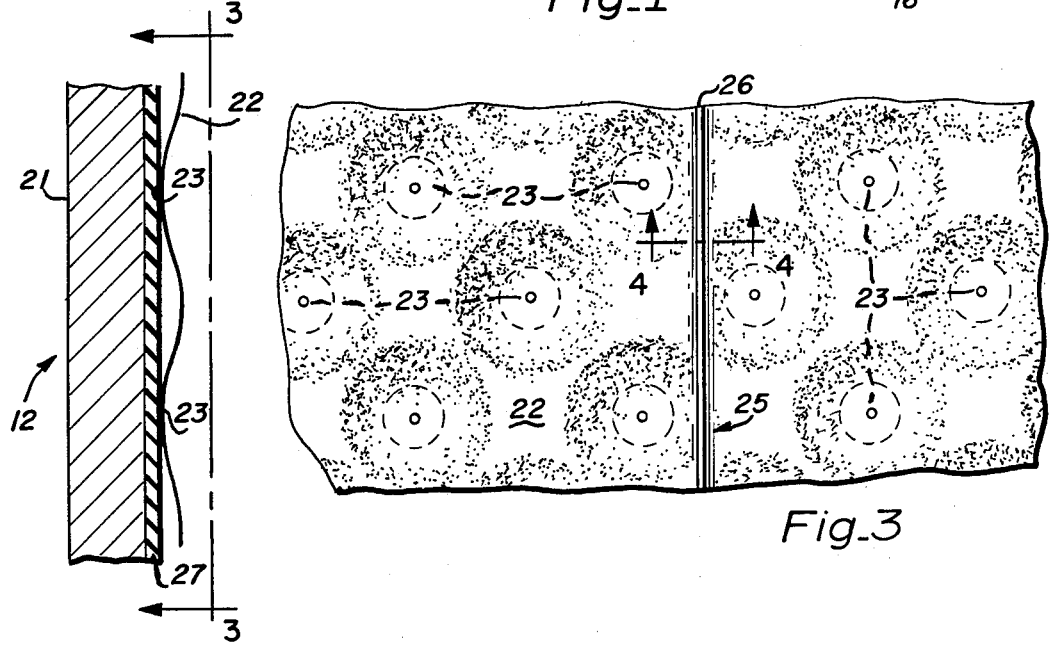
Fig_2
Fig_3
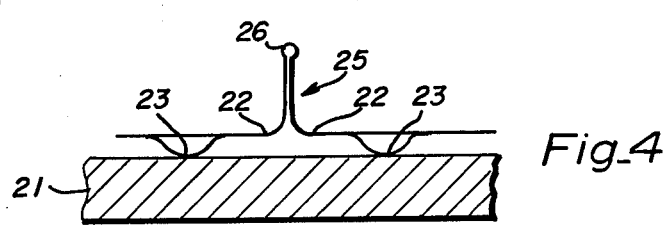
Fig_4

SUPERCONDUCTIVE MAGNETIC SHIELD AND METHOD OF MAKING SAME

BACKGROUND OF THE INVENTION

The present invention relates in general to superconductive magnetic shields and more particularly to an improved shield of the type wherein the superconductive shield material comprises a relatively thin sheet of foil supported from a more rigid support structure.

DESCRIPTION OF THE PRIOR ART

Heretofore, superconductive magnetic shields have been made and used of the type wherein a relatively thin sheet of superconductive material, such as lead, was flame sprayed onto a dielectric support structure as of fiberglass. The fiberglass support with the flame sprayed lead shield formed thereon was disposed in a cryostat and cooled to liquid helium temperature to produce a superconductive magnetic shielded region inside of the cylindrical fiberglass support. The cryostat included a centrally disposed room temperature access finger extending into the center of the shield.

The problem with this prior art flame sprayed lead shield was that it was extremely difficult to flame spray a relatively thin coating onto the fiberglass form without leaving relatively small openings, i.e., pin holes, in the shield member. As a result, magnetic flux leaked through these pin holes in the shield providing less than satisfactory shielding. Another and more serious problem with the flame sprayed superconductive magnetic shield was that as the shield was thermally cycled between room temperature and liquid helium temperature, thermally produced strains due to the differential in thermal expansion between the fiberglass and the lead coating produced crazing and fracture of the lead coating. As this fracturing occurred, the magnetic shielding effect was reduced until after a relatively small number of thermal cycles the shield became useless.

SUMMARY OF THE PRESENT INVENTION

The principal object of the present invention is the provision of an improved superconductive magnetic shield and method of making same.

In one feature of the present invention, a relatively thin sheet of superconductive magnetic shield material is secured to a support structure at a plurality of separated attachment points or spots so that the region of the shield material in between adjacent attachment points can bend during a thermal cycle to relieve strain caused by the unequal thermal expansion of the support and shield material, whereby cracks do not develop in the shield with repeated thermal cycling thereof in use.

In another feature of the present invention, adjacent marginal edges of the shield material are flanged and joined together, at the region of the flange, as by welding.

In another feature of the present invention, a relatively thin sheet of superconductive magnetic shield material is affixed to a support structure via the intermediary of a pattern of spaced bonding spots or points at which the shield material is bonded to the underlying support structure via the intermediary of spots of adhesive.

Other features and advantages of the present invention will become apparent upon a perusal of the folowing specification taken in connection with the accompanying drawings wherein:

BRIEF DESCRIPTION OF THE DRAWINGS

FIG. 1 is a longitudinal sectional view, in line diagram form, of a superconductive shield structure incorporating features of the present invention, FIG. 2 is an enlarged sectional view of a portion of the structure of FIG. 1 delineated by line 2—2, FIG. 3 is a side elevational view of a portion of the structure of FIG. 2 taken along line 3—3 in the direction of the arrows, and FIG. 4 is an enlarged sectional view of a portion of the structure of FIG. 3 taken along line 4—4 in the direction of the arrows.

DESCRIPTION OF THE PREFERRED EMBODIMENTS

Referring now to FIG. 1, there is shown a magnetic shield assembly 11 incorporating features of the present invention. The magnetic shield assembly 11 includes a generally cylindrical superconductive magnetic shield structure 12. The shield structure includes an elongated right circular cylindrical portion 13 open at one end and closed at the other end by means of a spherical end portion 14. The shield 12 is contained within a reentrant evacuated cryostat 15 having an outer cylindrical vacuum wall 16 closed at one end 16' and a centrally disposed cylindrical reentrant room temperature access finger 17 extending in from the other end 16". The room temperature access finger 17 extends coaxially into the central region of the shield structure 12.

The shield structure 12 is cooled to liquid helium temperature by means of liquid helium contained with a toroidal reservoir 18 and thermally conductively connected to the shield 12 via curved thermally conductive straps 19. The inside of the cryostat 15 is filled with superinsulation and helium vapor cooled shields of conventional design, not shown, which serve to thermally insulate the shield structure 12 from the surrounds of the cryostat 15.

Referring now to FIGS. 2-4, the shield structure 12 is shown in greater detail. More particularly, the shield structure 12 includes a nonsuperconductive support structure 21 having the same general shape as that of the superconductive shield 12. In a typical example, the support structure 21 is 1/16 inch thick 1100 aluminum providing high thermal conductivity in a relatively light rigid structure to allow relatively fast thermal cycling of the shield structure to minimize trapping of field gradients within the shield 12.

A superconductive shield member 22, preferably in the form of a relatively thin sheet compared to that of the support 21, is affixed to the support 21 via the intermediary of a multiplicity of spots of adhesive 23. In a typical example, the superconductive member 22 comprises lead foil of a thickness in the range of 0.001 inch to 0.010 inch. Other superconductive materials may be utilized including alloys of tin and lead.

The superconductive shield member 22 is conformed to the same general shape as that of the support 21 and is joined together in a hole-free manner preferably by flanging the adjacent marginal lips of the shield member 22 as shown in FIGS. 3 and 4 at 25. The mating flanges 25 are welded together at their exposed ends by a bead weld 26.

In a preferred embodiment, the superconductive shield member 22 is electrically insulated from the thermally conductive support structure 21 via the intermediary of an insulative coating 27 as of epoxy resin coated over the surface of the support 21.

The spots of attachment 23 for attaching the shield 22 to the support 21, in a preferred embodiment, are arranged in a closely packed pattern as indicated in FIG. 3. The spacing between adjacent spots 23 is preferably larger than the diameter of the spots. In a typical example, the spots 23 are ½ inch in diameter and the centerline spacing between the spots is 1.5 inches. The spot size and their spacing is chosen so that for a given thickness of the superconductive member 22, the shield is substantially nonmicrophonic as carried from the support 21.

In manufacture, the pattern of adhesive spots is deposited upon the support 21 and the shield member 22 is fitted to the support and bonded thereto by the adhesive spots 23. After the superconductive member 22 has been bonded to the support 21, the adjacent flange portions 25 are welded together at 26 to provide a hole-free superconductive shield structure 12.

As the shield is cooled to a superconductive temperature for the first time, the difference in thermal expansion between that of the support 21 and that of the shield 22 causes the shield to yield in the regions between adjacent points of attachment 23. This yielding action is not sufficient to exceed the plastic limit of the shield material 22. Upon warming of the shield 22 to near room temperature, buckling of the lead shield 22 between the adhesive spots 23 occurs, of sufficient magnitude to create a wrinkled pattern between adhesive spots but not of sufficient magnitude to cause a cracking, tearing or crazing of the shield material 22. A permanent waffle pattern is thereby formed in the shield structure 22. Subsequent thermal cycling between superconductive temperatures, as of 40° Kelvin, and room temperature permits the strains to be relieved due to the flexing of the waffled pattern. It has been discovered that the shield structure of the present invention may be repeatedly thermally cycled between room temperature and superconducting temperature without deleteriously affecting the shielding factor of the superconducting structure 12. Such a superconducting shield can provide a magnetic shield factor of $10^8$ or more.

What is claimed is:

1. In a method for fabricating a superconductive magnetic shield, the step of:
   securing a sheet of superconductive magnetic shield material having a first coefficient of thermal expansion to a support structure having a substantially different coefficient of thermal expansion by attaching said sheet to said support at a multiplicity of spaced positions so that said sheet can bend sufficiently in the spaces in between adjacent ones of said positions of attachment to relieve the strain caused by thermal cycling of said support and said shield, whereby cracks do not develop in said shield with repeated thermal cycling thereof in use; and
   including the step of thermally coupling said sheet of superconductive shield material to a heat sink to be operated at liquid helium temperature for cooling said sheet to a superconducting temperature.

2. In a method for fabricating a superconductive magnetic shield, the step of:
   securing a sheet of superconductive magnetic shield material having a first coefficient of thermal expansion to a support structure having a substantially different coefficient of thermal expansion by attaching said sheet to said support at a multiplicity of spaced positions so that said sheet can bend sufficiently in the spaces in between adjacent ones of said positions of attachment to relieve the strain caused by thermal cycling of said support and said shield, whereby cracks do not develop in said shield with repeated thermal cycling thereof in use; and
   wherein said support structure is electrically conducting and including the step of electrically insulating said sheet from said support structure to minimize trapping of thermally generated magnetic fields within said shield.

3. In a superconductive magnetic shield:
   magnetic shield means including a sheet of superconductive magnetic shield material having a first coefficient of thermal expansion;
   support means for supporting said magnetic shield means and having a second coefficient of thermal expansion substantially different than that of said first coefficient of thermal expansion;
   said magnetic shield means and said support means having mutually opposed major faces;
   attaching means for attaching together said major faces of said magnetic shield means and said support means at a multiplicity of spaced spots so that said shield means can bend sufficiently in the spaces in between adjacent ones of said spots of attachment to relieve the strain caused by thermal cycling of said support means and said magnetic shield means, whereby cracks do not develop in said magnetic shield means with repeated thermal cycling thereof in use;
   wherein said attaching means includes adhesive means interposed between said shield means and said support means at said spaced spots of attachment therebetween; and
   wherein said support means is made of aluminum.

4. In a superconductive magnetic shield:
   magnetic shield means including a sheet of superconductive magnetic shield material having a first coefficient of thermal expansion;
   support means for supporting said magnetic shield means and having a second coefficient of thermal expansion substantially different than that of said first coefficient of thermal expansion;
   said magnetic shield means and said support means having mutually opposed major faces;
   attaching means for attaching together said major faces of said magnetic shield means and said support means at a multiplicity of spaced spots so that said shield means can bend sufficiently in the spaces in between adjacent ones of said spots of attachment to relieve the strain caused by thermal cycling of said support means and said magnetic shield means, whereby cracks do not develop in said magnetic shield means with repeated thermal cycling thereof in use; and
   including heat sink means coupled in heat exchanging relation with said shield means for operation at liquid helium temperature for cooling said shield means to a superconductive temperature.

5. In a superconductive magnetic shield:
   magnetic shield means including a sheet of superconductive magnetic shield material having a first coefficient of thermal expansion;

support means for supporting said magnetic shield means and having a second coefficient of thermal expansion substantially different than that of said first coefficient of thermal expansion;

said magnetic shield means and said support means having mutually opposed major faces;

attaching means for attaching together said major faces of said magnetic shield means and said support means at a multiplicity of spaced spots so that said shield means can bend sufficiently in the spaces in between adjacent ones of said spots of attachment to relieve the strain caused by thermal cycling of said support means and said magnetic shield means, whereby cracks do not develop in said magnetic shield means with repeated thermal cycling thereof in use; and wherein said support means is electrically conductive and including, means for electrically insulating said magnetic shield means from said support means to minimize trapping of thermally generated magnetic fields within said magnetic shield means.

* * * * *